United States Patent
Hsiao

(10) Patent No.: US 9,928,886 B2
(45) Date of Patent: Mar. 27, 2018

(54) LOW POWER MEMORY DEVICE

(71) Applicant: Chih-Cheng Hsiao, Taichung (TW)

(72) Inventor: Chih-Cheng Hsiao, Taichung (TW)

(*) Notice: Subject to any disclaimer, the term of this patent is extended or adjusted under 35 U.S.C. 154(b) by 0 days.

(21) Appl. No.: 15/497,229

(22) Filed: Apr. 26, 2017

(65) Prior Publication Data

US 2017/0372758 A1  Dec. 28, 2017

Related U.S. Application Data

(60) Provisional application No. 62/353,558, filed on Jun. 23, 2016.

(51) Int. Cl.
G11C 7/02 (2006.01)
G11C 7/10 (2006.01)
G11C 8/14 (2006.01)
G11C 8/12 (2006.01)

(52) U.S. Cl.
CPC .......... *G11C 7/1006* (2013.01); *G11C 7/1018* (2013.01); *G11C 8/12* (2013.01); *G11C 8/14* (2013.01)

(58) Field of Classification Search
CPC ............ G11C 11/1655; G11C 2213/79; G11C 13/0026; G11C 8/08
See application file for complete search history.

(56) References Cited

U.S. PATENT DOCUMENTS

| | | | |
|---|---|---|---|
| 4,420,821 A | 12/1983 | Hoffman | |
| 5,754,468 A * | 5/1998 | Hobson | H01L 27/1104 365/154 |
| 6,661,699 B1 * | 12/2003 | Walker | G11C 11/404 365/149 |
| 6,757,196 B1 * | 6/2004 | Tsao | G11C 16/0433 365/185.05 |
| 7,414,893 B2 * | 8/2008 | La Rosa | G11C 16/0433 365/185.23 |
| 9,275,710 B2 * | 3/2016 | Chan | G11C 8/16 |
| 2004/0099885 A1 * | 5/2004 | Yeo | H01L 27/11 257/208 |
| 2007/0041242 A1 * | 2/2007 | Okazaki | G11C 11/412 365/154 |
| 2007/0211519 A1 * | 9/2007 | Thomas | G11C 11/412 365/154 |
| 2008/0151604 A1 * | 6/2008 | Suzuki | G11C 11/412 365/154 |
| 2010/0302831 A1 | 12/2010 | Takeyama | |

(Continued)

*Primary Examiner* — Tuan T Nguyen
(74) *Attorney, Agent, or Firm* — Winston Hsu

(57) ABSTRACT

A memory device comprises a plurality of word lines elongated along a first direction, and at least one memory unit. The at least one memory unit comprises a plurality of memory cells arranged along a second direction different from the first direction; at least one bit line elongated along the second direction, and configured to transmit data of a selected memory cell; and at least one column word line elongated along the second direction; wherein the memory cell comprises a storage cell configured to store data and at least two access transistors; wherein a control terminal of one of the at least two access transistors of the memory cell is coupled to the at least one column word line, and a control terminal of another one of the at least two access transistors of the memory cell is coupled to the corresponding word line.

9 Claims, 10 Drawing Sheets

(56) References Cited

U.S. PATENT DOCUMENTS

2011/0157965 A1* 6/2011 Nii ..................... G11C 11/4125
                                                          365/156
2013/0021839 A1* 1/2013 Ishikura ................ G11C 11/412
                                                          365/154

* cited by examiner

LOW POWER MEMORY DEVICE

CROSS REFERENCE TO RELATED APPLICATIONS

This application claims priority of U.S. Provisional No. 62/353,558 filed on Jun. 23, 2016.

BACKGROUND OF THE INVENTION

1. Field of the Invention

The present invention relates to a memory device, and more particularly, to a memory device with low power consumption.

2. Description of the Prior Art

Generally, a memory device comprises a plurality of word lines, a plurality of bit lines, and a plurality of memory cells arranged in a matrix form. Each of the word line is coupled to a row of the memory cells. Each of the bit line is coupled to a column of the memory cells. Please refer to FIG. 1. FIG. 1 is a diagram showing a memory cell of the prior art. As shown in FIG. 1, the memory cell is a 5T SRAM cell, which is consisted of five transistors. The memory cell comprises a storage cell SC and an access transistor T. The access transistor T has a first terminal coupled to the storage cell SC, a second terminal coupled to a corresponding bit line, and a control terminal coupled to a corresponding word line. As such, when the access transistor T is turned on by the word line, the storage cell SC is coupled to the bit line for performing read/write operation.

Please refer to FIG. 2. FIG. 2 is a diagram showing another memory cell of the prior art. As shown in FIG. 2, the memory cell is a 6T SRAM cell, which is consisted of six transistors. The memory cell comprises a storage cell SC and two access transistor Ta, Tb. Each of the access transistor Ta, Tb is configured to control conduction between the storage cell SC and a corresponding bit line. Control terminals of the access transistor Ta, Tb can be coupled to a same word line or to two different word lines according to design requirements. As such, when the access transistor Ta, Tb is turned on by the word line, the storage cell SC is coupled to the bit line for performing the read/write operation.

In the memory device of the prior art, when one of the word lines selects a corresponding row of the memory cells, all the bit lines of the memory device are coupled to corresponding selected memory cells for the read/write operation. However, during the read/write operation, some of the bit lines are not required to transmit data. The idle bit lines consume power during the read/write operation, such that the memory device of the prior art has higher power consumption.

SUMMARY OF THE INVENTION

The present invention provides a memory device comprising a plurality of word lines elongated along a first direction, and at least one memory unit. The at least one memory unit comprises a plurality of memory cells arranged along a second direction different from the first direction; at least one bit line elongated along the second direction, and configured to transmit data of a selected memory cell; and at least one column word line elongated along the second direction; wherein the memory cell comprises a storage cell configured to store data and at least two access transistors; wherein a control terminal of one of the at least two access transistors of the memory cell is coupled to the at least one column word line, and the other control terminal of another one of the at least two access transistors of the memory cell is coupled to the corresponding word line.

The present invention further provides a memory device comprising a plurality of word lines elongated along a first direction, and at least one memory unit. The at least one memory unit comprises a plurality of memory cells arranged along a second direction different from the first direction; at least one bit line elongated along the second direction, and configured to transmit data of a selected memory cell; and at least one column word line elongated along the second direction; wherein the memory cell comprises a storage cell configured to store data and at least one access transistors; wherein the at least one access transistor is a double gate transistor; wherein a control terminal of the double gate transistor of the memory cell is coupled to the at least one column word line, and another control terminal of the double gate transistor is coupled to the corresponding word line.

The present invention further provides a memory device comprising a plurality of word lines elongated along a first direction, and a plurality of memory units. Each of the memory unit comprises a plurality of memory cells arranged along a second direction different from the first direction; at least one bit line elongated along the second direction, and configured to transmit data of a selected memory cell; and at least one column word line elongated along the second direction; wherein the selected memory cell is selected by a corresponding word line and the at least one column word line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
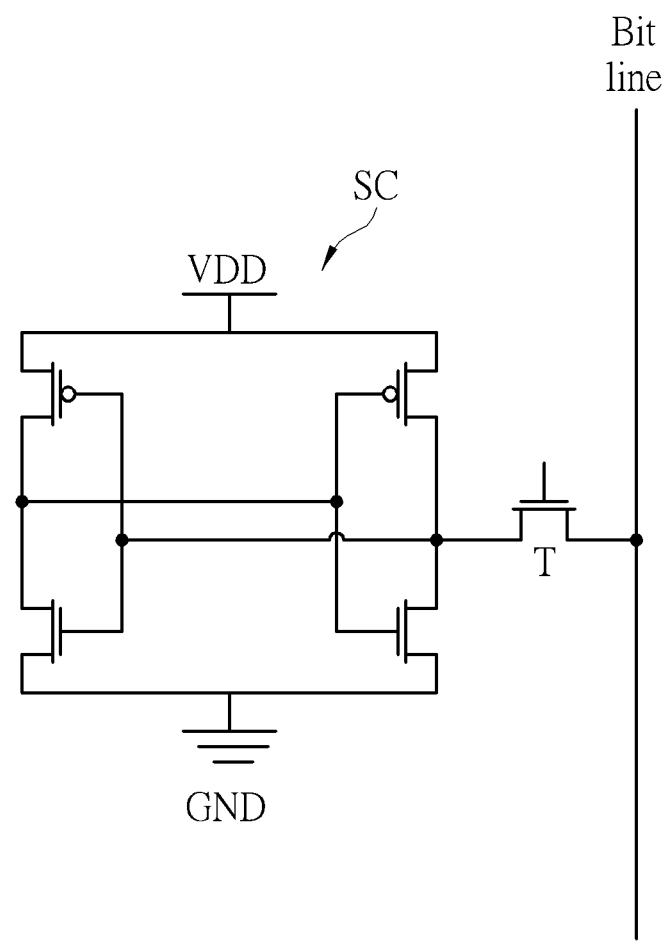
FIG. 1 is a diagram showing a memory cell of the prior art.
Figure 3:
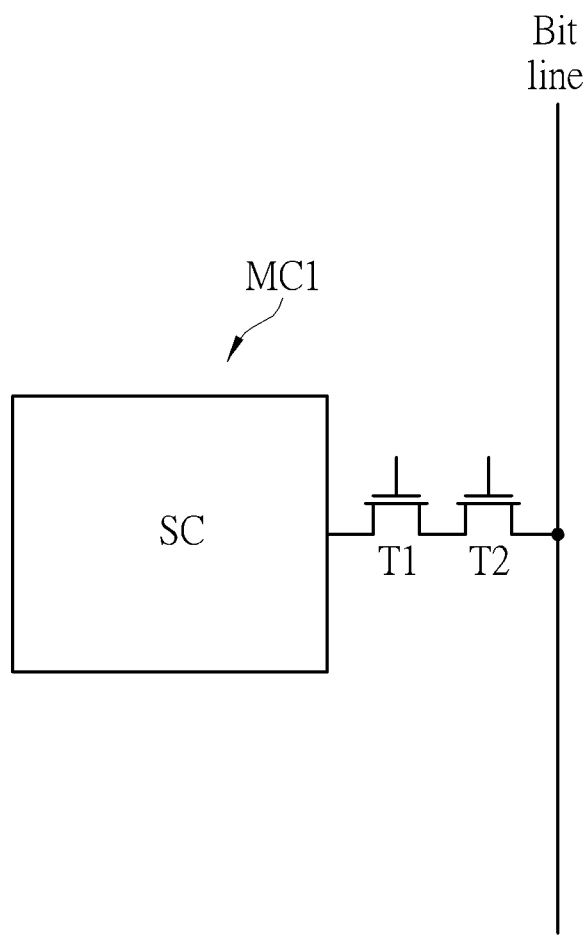
FIG. 3 is a diagram showing a first embodiment of a memory cell of the present invention.

Please refer to FIG. 3. FIG. 3 is a diagram showing a first embodiment of a memory cell of the present invention. As shown in FIG. 3, the memory cell MC1 of the present invention comprises a storage cell SC and two access transistors T1, T2. Arrangement of the storage cell SC in FIG. 3 can be similarly to arrangement of the storage cell SC in FIG. 1, but the present invention is not limited thereto. The two access transistors T1, T2 are connected in series between the storage cell SC and a bit line. The storage cell SC is configured to store data. The two access transistors T1, T2 are configured to control conduction between the storage cell SC and the bit line. When voltages on both control terminals of the access transistors T1, T2 are pulled up to turn on the access transistors T1, T2, data transmission between the storage cell SC and the bit line is enabled, in order to perform read/write operation of the memory cell MC1.

Figure 2:
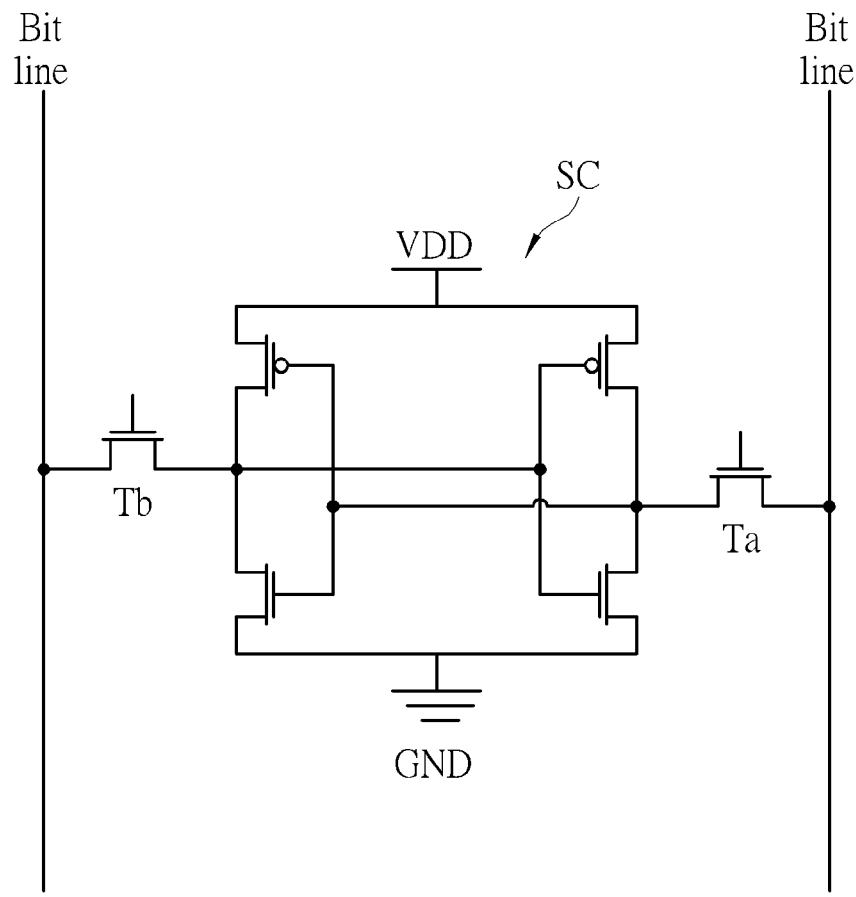
FIG. 2 is a diagram showing another memory cell of the prior art.
Figure 4:
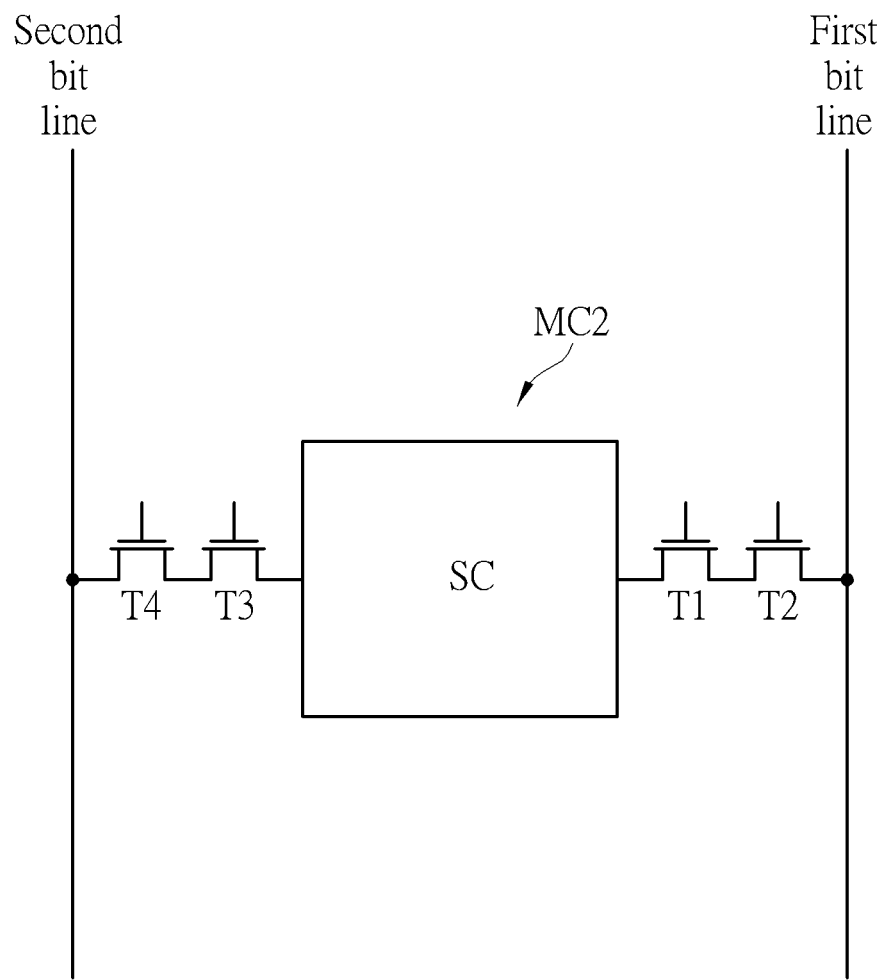
FIG. 4 is a diagram showing a second embodiment of the memory cell of the present invention.

Please refer to FIG. 4. FIG. 4 is a diagram showing a second embodiment of a memory cell of the present invention. As shown in FIG. 4, the memory cell MC2 of the present invention comprises a storage cell SC and four access transistors T1-T4. Arrangement of the storage cell SC in FIG. 4 can be similarly to arrangement of the storage cell SC in FIG. 2, but the present invention is not limited thereto. The access transistors T1, T2 are connected in series between the storage cell SC and a first bit line, and the access transistors T3, T4 are connected in series between the storage cell SC and a second bit line. The storage cell SC is configured to store data. The access transistors T1, T2 are configured to control conduction between the storage cell SC and the first bit line. When voltages on both control terminals of the access transistors T1, T2 are pulled up to turn on the access transistors T1, T2, data transmission between the storage cell SC and the first bit line is enabled, in order to perform read/write operation of the memory cell MC1. Similarly, the access transistors T3, T4 are configured to control conduction between the storage cell SC and the second bit line. When voltages on both control terminals of the access transistors T3, T4 are pulled up to turn on the access transistors T3, T4, data transmission between the storage cell SC and the second bit line is enabled, in order to perform read/write operation of the memory cell MC1.

Figure 5:
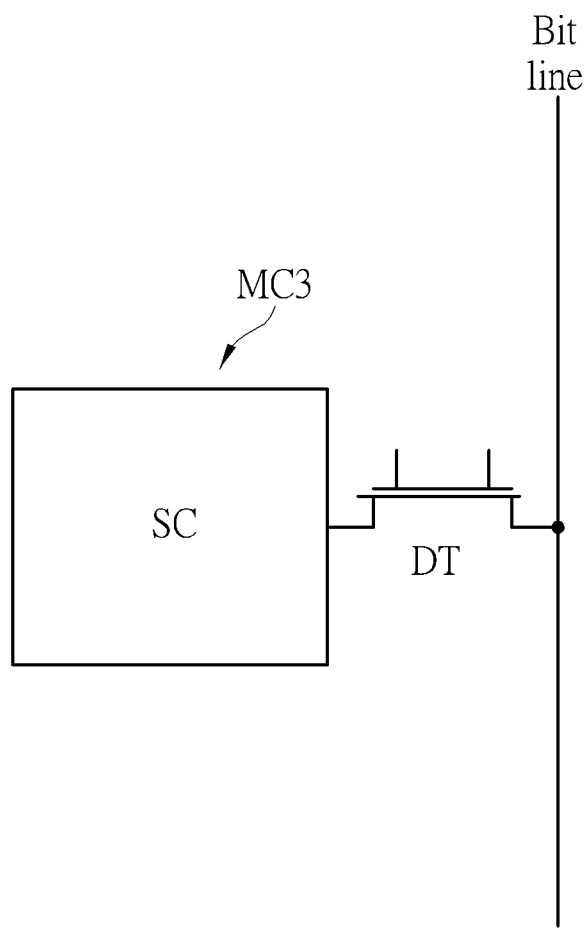
FIG. 5 is a diagram showing a third embodiment of the memory cell of the present invention.

Please refer to FIG. 5. FIG. 5 is a diagram showing a third embodiment of a memory cell of the present invention. As shown in FIG. 5, the memory cell MC3 of the present invention comprises a storage cell SC and a double gate transistor DT. Arrangement of the storage cell SC in FIG. 5 can be similarly to arrangement of the storage cell SC in FIG. 1, but the present invention is not limited thereto. The double gate transistor DT is connected between the storage cell SC and a bit line. The storage cell SC is configured to store data. The double gate transistor DT is configured to control conduction between the storage cell SC and the bit line. When voltages on two control terminals of the double gate transistor DT is pulled up to turn on the double gate transistor DT, data transmission between the storage cell SC and the bit line is enabled, in order to perform read/write operation of the memory cell MC3.

Figure 6:
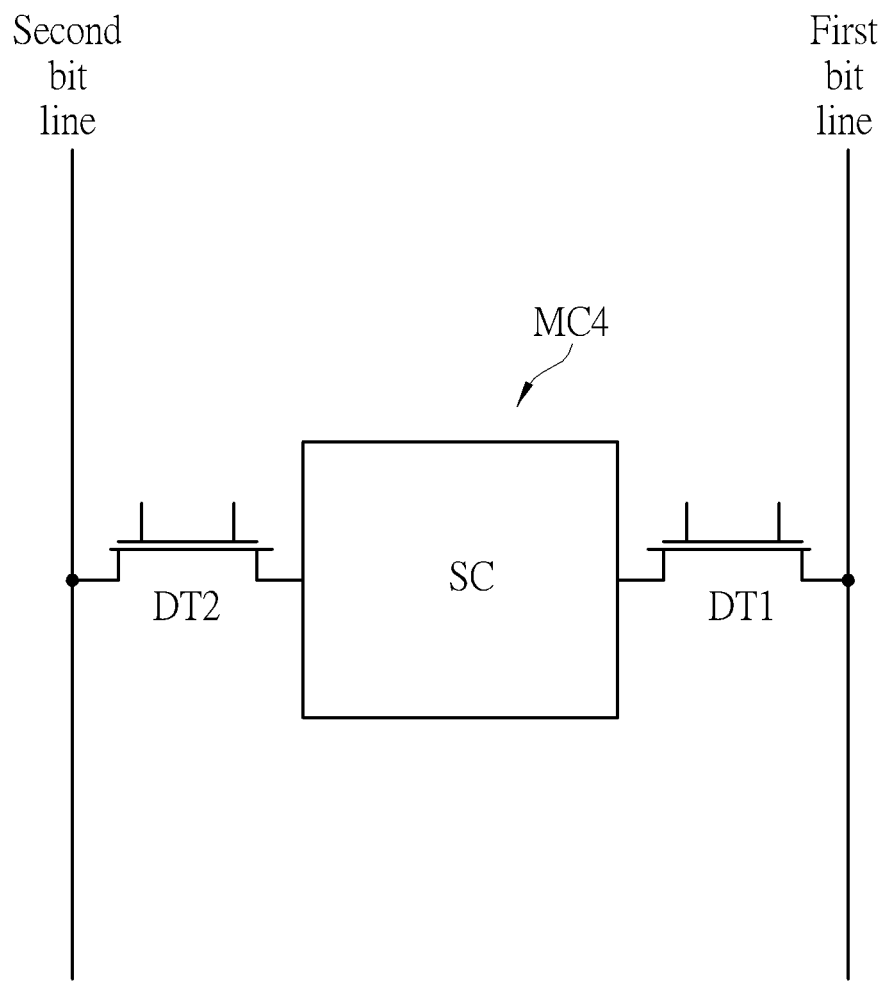
FIG. 6 is a diagram showing a fourth embodiment of the memory cell of the present invention.

Please refer to FIG. 6. FIG. 6 is a diagram showing a fourth embodiment of the memory cell of the present invention. As shown in FIG. 5, the memory cell MC4 of the present invention comprises a storage cell SC and two double gate transistors DT1, DT2. Arrangement of the storage cell SC in FIG. 6 can be similarly to arrangement of the storage cell SC in FIG. 2, but the present invention is not limited thereto. The double gate transistor DT1 is connected between the storage cell SC and a first bit line, and the double gate transistor DT2 is connected between the storage cell SC and a second bit line. The storage cell SC is configured to store data. The double gate transistor DT1 is configured to control conduction between the storage cell SC and the first bit line. When voltages on two control terminals of the double gate transistor DT1 is pulled up to turn on the double gate transistor DT1, data transmission between the storage cell SC and the first bit line is enabled, in order to perform read/write operation of the memory cell MC4. Similarly, the double gate transistor DT2 is configured to control conduction between the storage cell SC and the second bit line. When voltages on two control terminals of the double gate transistor DT2 is pulled up to turn on the double gate transistor DT2, data transmission between the storage cell SC and the second bit line is enabled, in order to perform read/write operation of the memory cell MC4.

In addition, a double gate transistor has at least two control terminals. When the double gate transistor has just two control terminals, the double gate transistor can be turned on to conduct when voltages on the both control terminals are higher than a threshold voltage. When the double gate transistor has more than two control terminals, the double gate transistor can be turned on to conduct when voltages on all the control terminals are higher than the threshold voltage, or when voltages on two of the control terminals are higher than the threshold voltage with the rest control terminal being configured to control a specific property, such as controlling a level of a current passing through the double gate transistor.

Figure 7:
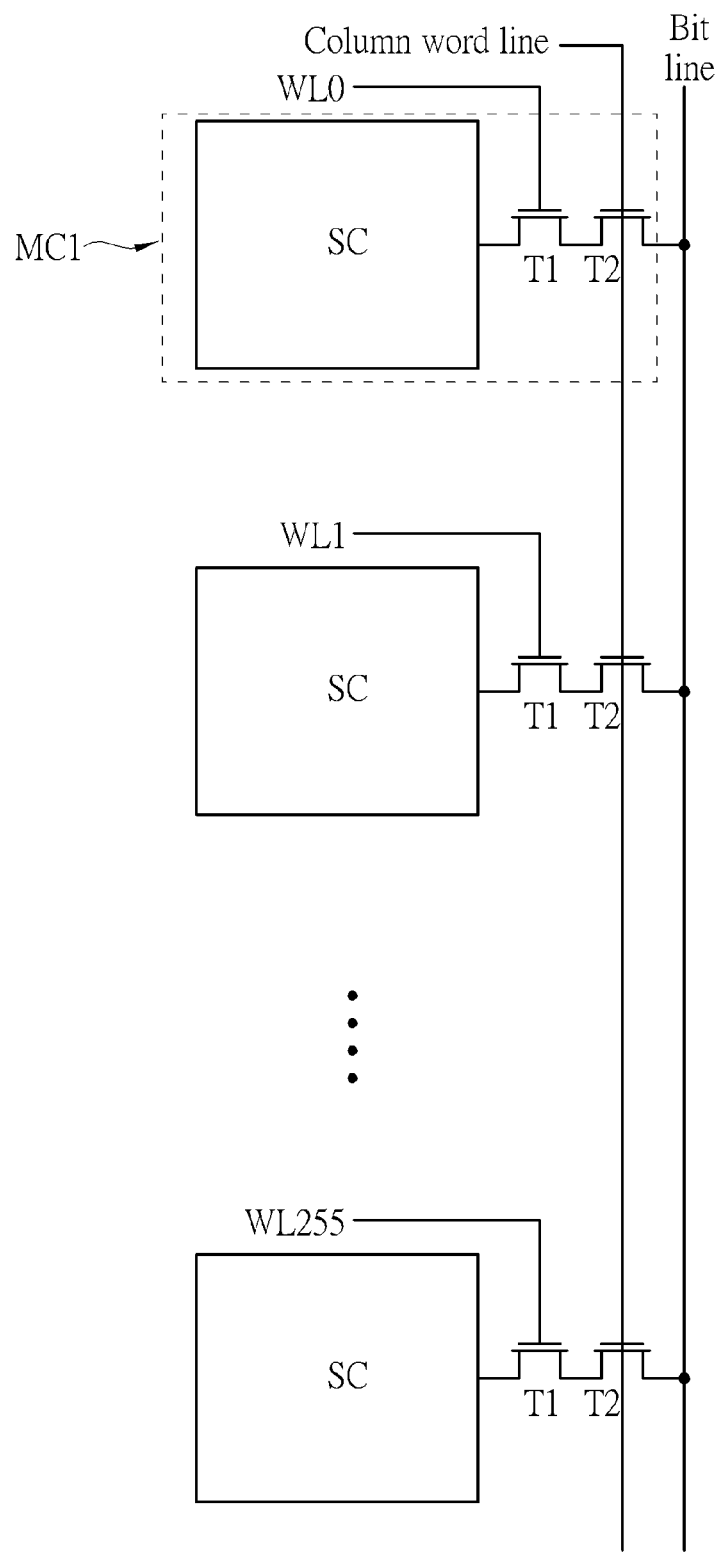
FIG. 7 is a diagram showing a memory unit with the first embodiment of the memory cell of the present invention.
Figure 9:
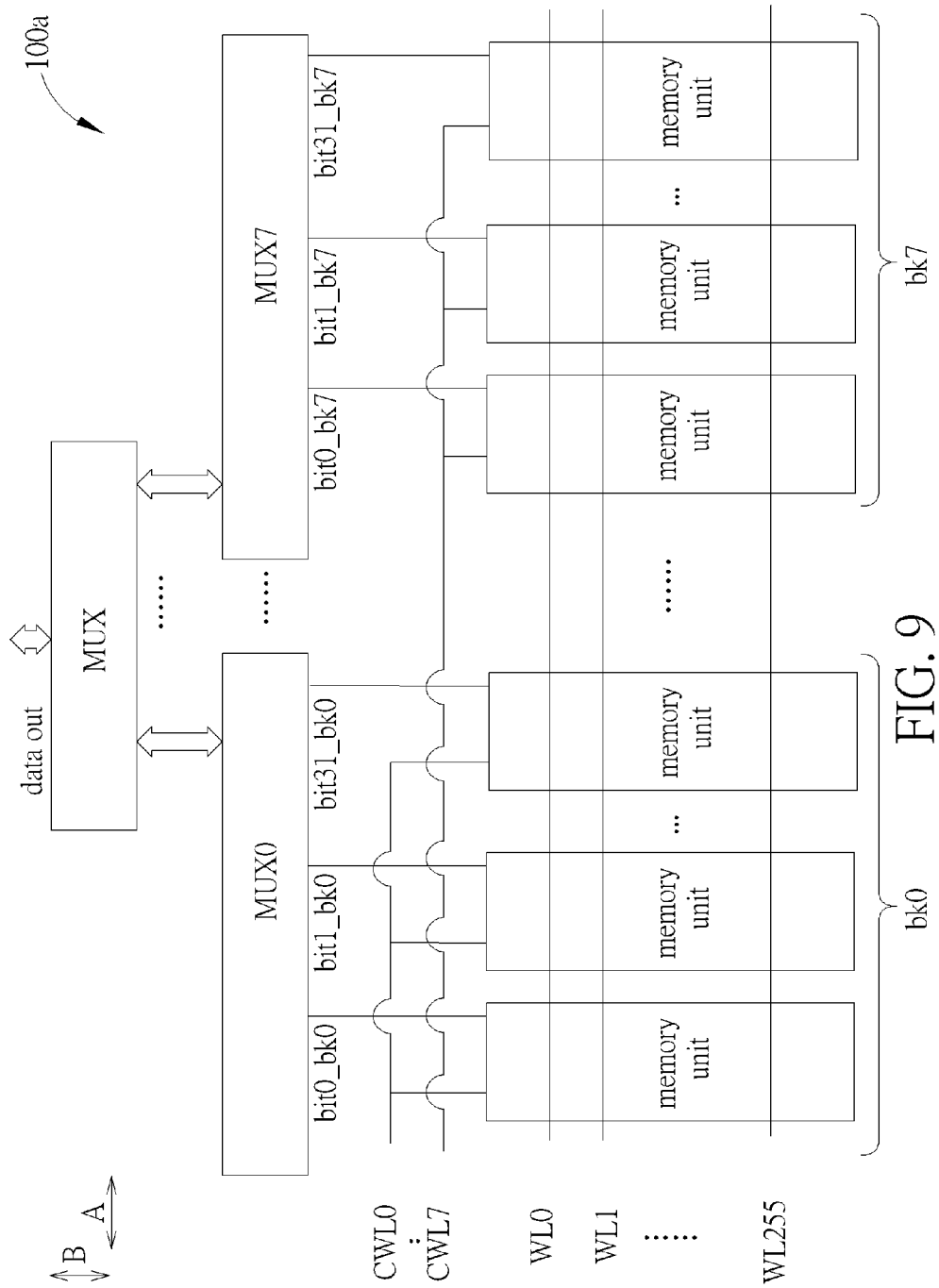
FIG. 9 is a diagram showing a first embodiment of a memory device of the present invention.

Please refer to FIG. 7 and FIG. 9 together. FIG. 7 is a diagram showing a memory unit with the first embodiment of the memory cell of the present invention. FIG. 9 is a diagram showing a first embodiment of a memory device 100a of the present invention. In the present embodiment, the memory cells MC1 are arranged into a matrix having 256 rows and 256 columns, but the present invention is not limited thereto. The memory unit in FIG. 7 can be applied to the memory device 100a in FIG. 9 for representing a column of the memory cells MC1 and related signal lines. As shown in figures, the plurality of memory cells MC1 are divided into a predetermined number (such as 8) of memory blocks bk0-bk7, and each of the memory blocks bk0-bk7 comprises 32 columns of the memory cells. Moreover, in addition to the memory cells MC1, the word lines WL0-WL255, and the bit lines (bit0_bk0 to bit31_bk7), the memory device 100a further comprises a plurality of multiplexers MUX0-MUX7. Each of the multiplexers MUX0-MUX7 is coupled to bit lines (bit0_bk0 to bit31_bk7) of 32 columns of the memory cells MC1 of a corresponding memory block bk0-bk7. For example, the multiplexer MUX0 is coupled to bit lines (bit0_bk0 to bit31_bk0) of 32 columns of the memory cells MC1 of the memory block bk0, the multiplexer MUX7 is coupled to bit lines (bit0_bk7 to bit31_bk7) of 32 columns of the memory cells MC1 of the memory block bk7, and so on.

The memory device 100a further comprises a plurality of column word lines CWL0-CWL7 elongated along a second direction B. The control terminal of the access transistor T1 of each of the memory cell MC1 is coupled to a corresponding world line WL0-WL255, and the control terminal of the access transistor T2 of each of the memory cell MC1 is coupled to a corresponding column world line CWL0-CWL7. Each of the column word lines CWL0-CWL7 is configured to control on/off states of the access transistors T2 of the memory cells MC1 of a corresponding memory block bk0-bk7. For example, the column word line CWL0 is coupled to the control terminals of the 256 access transistors T2 of each column of the memory cells MC1 of the memory block bk0, the column word line CWL7 is coupled to the control terminals of the 256 access transistors T2 of each column of the memory cells MC1 of the memory block bk7, and so on. As such, each of the column word lines CWL0-

CWL7 can control on/off states of all the access transistors T2 of the memory cells MC1 of a corresponding memory block bk0-bk7 simultaneously, and the access transistors T2 of the memory cells MC1 of different memory blocks bk0-bk7 can be controlled individually.

According to the above arrangement, when one of the word lines WL0-WL255 selects a corresponding row of the memory cells MC1 for read/write operation, the column word lines CWL0-CWL7 can be used to further select the memory cells MC1 of the specific memory block bk0-bk7 for the read/write operation. For example, when the column word line CWL0 transmits a control signal to the control terminals of the access transistors T2 of the memory cells MC1 of the memory block bk0, only the access transistors T2 of the memory cells MC1 of the memory block bk0 are turned on to couple the memory cells MC1 on the selected row of the memory block bk0 to the corresponding bit lines (bit0_bk0 to bit31_bk0), for allowing the corresponding bit lines (bit0_bk0 to bit31_bk0) to transmit data. On the other hand, other bit lines corresponding to the memory block bk1-bk7 are not driven to transmit data. Therefore, the power consumption of the memory device 100a can be reduced.

In addition, each of the memory cells of the memory device 100a may correspond to a plurality of bit lines. For example, when the memory cell MC1 in the memory device 100a is replaced by the memory cell MC2 in FIG. 4, the memory cell MC2 can be selected to couple to two bit lines. Accordingly, two or more column word lines can be arranged to control electrical connections between the memory cell MC2 and the two bit lines.

Figure 10:
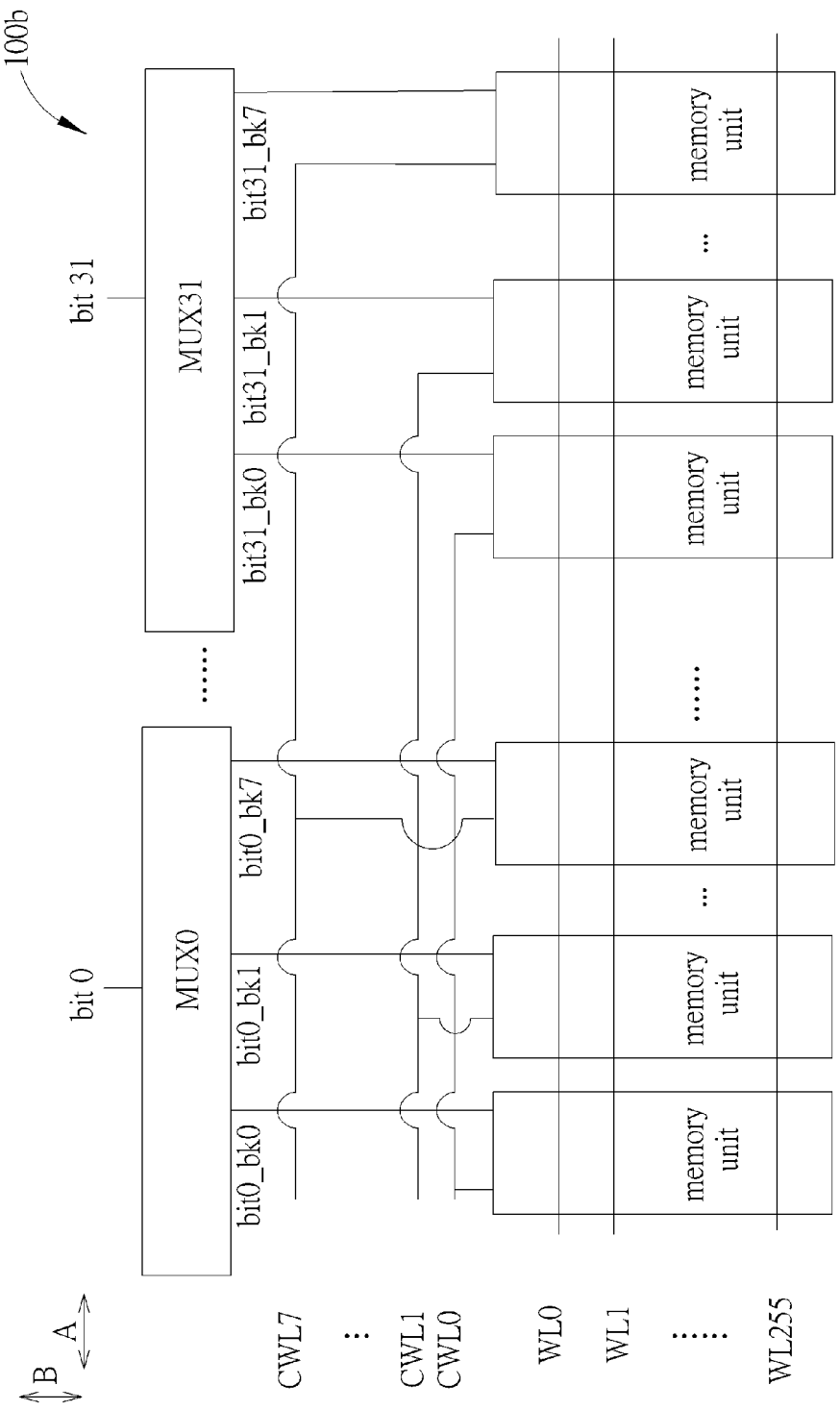
FIG. 10 is a diagram showing a second embodiment of the memory device of the present invention.

Please refer to FIG. 7 and FIG. 10 together. FIG. 10 is a diagram showing a second embodiment of the memory device of the present invention. In the present embodiment, the memory cells MC1 are arranged into a matrix having 256 rows and 256 columns, but the present invention is not limited thereto. The memory unit in FIG. 7 can be applied to the memory device 100b in FIG. 10 for representing a column of the memory cells MC1 and related signal lines. As shown in figures, in addition to the memory cells MC1, the word lines WL0-WL255, and the bit lines (bit0_bk0 to bit31_bk7), the memory device 100b further comprises a plurality of multiplexers MUX0-MUX31. Moreover, the bit lines (bit0_bk0 to bit31_bk7) of each memory block bk0-bk7 are scattered sequentially. For example, the multiplexer MUX0 is coupled to bit lines (bit0_bk0 to bit0_bk7) of first columns of the memory cells of the memory blocks bk0-bk7, the multiplexer MUX31 is coupled to bit lines (bit31_bk0 to bit31_bk7) of 32th columns of the memory cells of the memory blocks bk0-bk7, and so on.

Although the bit lines (bit0_bk0 to bit31_bk7) of each memory block bk0-bk7 are scattered sequentially, each of the column word lines CWL0-CWL7 is still configured to control on/off states of the access transistors T2 of the memory cells MC1 of a corresponding memory block bk0-bk7. For example, the column word line CWL0 is coupled to the control terminals of the 256 access transistors T2 of each column of the memory cells MC1 of the memory block bk0, the column word line CWL7 is coupled to the control terminals of the 256 access transistors T2 of each column of the memory cells MC of the memory block bk7, and so on. As such, each of the column word lines CWL0-CWL7 can control on/off states of all the access transistors T2 of the memory cells MC1 of a corresponding memory block bk0-bk7 simultaneously, and the access transistors T2 of the memory cells MC1 of different memory blocks bk0-bk7 can be controlled individually.

Similarly, when one of the word lines WL0-WL255 selects a corresponding row of the memory cells MC1 for the read/write operation, the column word lines CWL0-CWL7 can be used to further select the memory cells MC1 of the specific memory block bk0-bk7 for the read/write operation. For example, when the word line CWL0 transmits a control signal to the control terminals of the access transistors T2 of the memory cells MC1 of the memory block bk0, only the access transistors T2 of the memory cells MC1 of the memory block bk0 are turned on to couple the memory cells MC1 on the selected row of the memory block bk0 to the corresponding bit lines (bit0_bk0 to bit31_bk0), for allowing the corresponding bit lines (bit0_bk0 to bit31_bk0) to transmit data. On the other hand, other bit lines corresponding to the memory block bk1-bk7 are not driven to transmit data. Therefore, the power consumption of the memory device 100b can be reduced.

Similarly, each of the memory cells of the memory device 100b may also correspond to a plurality of bit lines. For example, when the memory cell MC1 in the memory device 100b is replaced by the memory cell MC2 in FIG. 4, the memory cell MC2 can be selected to couple to two bit lines. Accordingly, two or more column word lines can be arranged to control electrical connections between the memory cell MC2 and the two bit lines.

Figure 8:
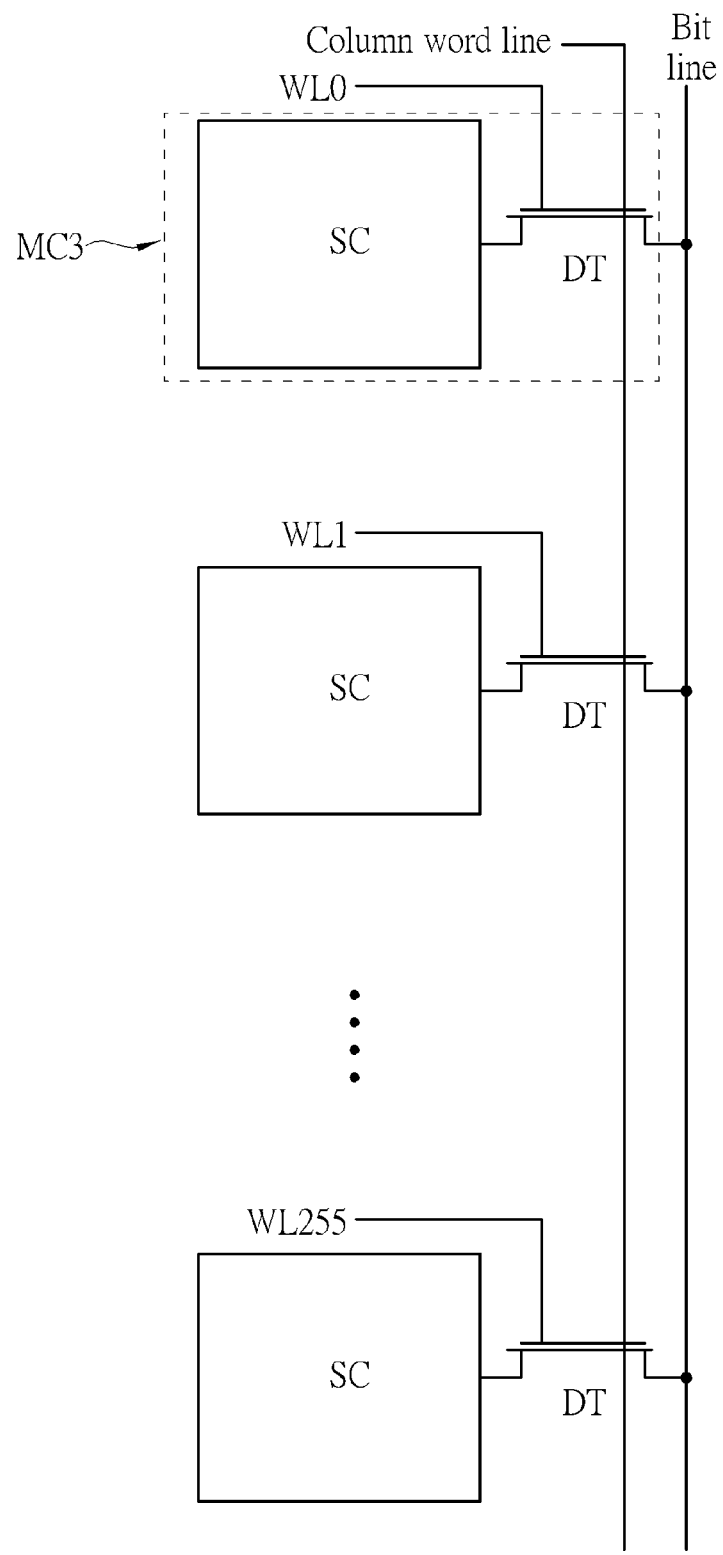
FIG. 8 is a diagram showing a memory unit with the third embodiment of the memory cell of the present invention.

Please refer to FIG. 8. FIG. 8 is a diagram showing a memory unit with the third embodiment of the memory cell of the present invention. Different from the memory unit in FIG. 7, the memory unit in FIG. 8 replaces the memory cell MC1 by the memory cell MC3. Similarly, the memory unit in FIG. 8 can also applied to the memory device 100a in FIG. 9 and the memory device 100b in FIG. 10. Since a way of controlling conduction between the storage cell SC and the bit line of FIG. 8 is similar to that of FIG. 7, no further explanation for operation of the memory device 100a, 100b with the memory cell MC3 is provided.

On the other hand, when the memory cell MC3 in the memory device 100a, 100b is replaced by the memory cell MC4 in FIG. 6, the memory cell MC4 can be selected to couple to two bit lines. Accordingly, two or more column word lines can be arranged to control electrical connections between the memory cell MC4 and the two bit lines.

In addition, when the memory cell MC2 is applied to the memory device 100a, 100b, the two series connected access transistors T1 and T2 (or T3 and T4) at one side of the storage cell SC can be replaced by a single transistor (or other arrangement of transistors). In other words, conduction at one side of the storage cell SC is controlled by a word line and a column word line, and conduction at the other side of the storage cell SC is controlled by a word line (or other signal line). Furthermore, when the memory cell MC4 is applied to the memory device 100a, 100b, the double gate transistor DT1 or DT2 at one side of the storage cell SC can be replaced by a single transistor (or other arrangement of transistors). In other words, conduction at one side of the storage cell SC is controlled by a word line and a column word line, and conduction at the other side of the storage cell SC is controlled by a word line (or other signal line).

Moreover, in the above embodiments, the voltages on the control terminals are pulled up to turn on the access transistors or the double gate transistors, but the present invention is not limited thereto. In other embodiments of the present invention, the voltages on the control terminals can be pulled down to turn on the access transistors or the double gate transistors.

In contrast to the prior art, each of the memory cell of the present invention comprises at least two access transistors or a double gate transistor coupled between the storage cell and the bit line, such that the memory device of the present invention can further select specific memory cells to be coupled to corresponding bit lines, where other bit lines corresponding to the unselected memory cells are not driven to transmit data. Therefore, the memory device of the present invention has lower power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a plurality of word lines elongated along a first direction; and
at least one memory unit comprising:
a plurality of memory cells arranged along a second direction different from the first direction;
at least one bit line elongated along the second direction, and configured to transmit data of a selected memory cell; and
at least one column word line elongated along the second direction;
wherein the memory cell comprises a storage cell configured to store data and at least two access transistors;
wherein a control terminal of one of the at least two access transistors of the memory cell is coupled to the at least one column word line, and a control terminal of another one of the at least two access transistors of the memory cell is coupled to the corresponding word line.

2. The memory device of claim 1, wherein the selected memory cell is selected by a corresponding word line and the at least one column word line.

3. The memory device of claim 1, wherein the memory device comprises a plurality of the memory units arranged along the first direction, a predetermined number of the memory units form a memory block, and the column word lines of the memory units are grouped to control the corresponding control terminal of access transistors of memory cells of corresponding memory blocks respectively.

4. A memory device, comprising:
a plurality of word lines elongated along a first direction; and
at least one memory unit comprising:
a plurality of memory cells arranged along a second direction different from the first direction;
at least one bit line elongated along the second direction, and configured to transmit data of a selected memory cell; and
at least one column word line elongated along the second direction;
wherein the memory cell comprises a storage cell configured to store data and at least one access transistor;
wherein the at least one access transistor is a double gate transistor;
wherein a control terminal of the double gate transistor of the memory cell is coupled to the at least one column word line and another control terminal of the double gate transistor is coupled to the corresponding word line.

5. The memory device of claim 4, wherein the selected memory cell is selected by a corresponding word line and the at least one column word line.

6. The memory device of claim 4, wherein the memory device comprises a plurality of the memory units arranged along the first direction, a predetermined number of the memory units form a memory block, and the column word lines of the memory units are grouped to control the corresponding control terminal of access transistors of memory cells of corresponding memory blocks respectively.

7. The memory device of claim 4, wherein the double gate transistor has at least two control terminals.

8. The memory device of claim 4, wherein the double gate transistor has more than two control terminals.

9. A memory device, comprising:
a plurality of word lines elongated along a first direction; and
a plurality of memory units,
each of the memory unit comprising:
a plurality of memory cells arranged along a second direction different from the first direction;
at least one bit line elongated along the second direction, and configured to transmit data of a selected memory cell; and
at least one column word line elongated along the second direction;
wherein the selected memory cell is selected by a corresponding word line and the at least one column word line.

* * * * *